(12) United States Patent
Gray et al.

(10) Patent No.: US 11,085,973 B2
(45) Date of Patent: Aug. 10, 2021

(54) SYSTEMS AND METHODS FOR DETECTING LEAKAGE IN A CABLE NETWORK SYSTEM

(71) Applicant: VIAVI SOLUTIONS, INC., San Jose, CA (US)

(72) Inventors: Adam D. Gray, Avon, IN (US); Daniel K. Chappell, Greenwood, IN (US); Loren Eggert, Indianapolis, IN (US)

(73) Assignee: VIAVI SOLUTIONS, INC., San Jose, CA (US)

( * ) Notice: Subject to any disclaimer, the term of this patent is extended or adjusted under 35 U.S.C. 154(b) by 314 days.

(21) Appl. No.: 16/370,877

(22) Filed: Mar. 29, 2019

(65) Prior Publication Data

US 2019/0304625 A1 Oct. 3, 2019

Related U.S. Application Data

(60) Provisional application No. 62/650,131, filed on Mar. 29, 2018.

(51) Int. Cl.
*G01R 31/52* (2020.01)
*H04B 17/354* (2015.01)
*H01B 7/32* (2006.01)

(52) U.S. Cl.
CPC .............. *G01R 31/52* (2020.01); *H01B 7/32* (2013.01); *H04B 17/354* (2015.01)

(58) Field of Classification Search
CPC ........ G01R 31/52; H04B 17/354; H01L 37/32
See application file for complete search history.

(56) References Cited

U.S. PATENT DOCUMENTS

| 2015/0264343 A1* | 9/2015 | Bush ................ H04N 7/106 725/107 |
| 2016/0037188 A1* | 2/2016 | Stelle, IV ........... H04N 21/235 725/116 |
| 2016/0197678 A1* | 7/2016 | Zheng ............. H01S 5/06226 398/183 |

OTHER PUBLICATIONS

Viavi Solutions Inc., OneExpert CATV, Sweep and Plant Maintenance System ONX-630 / SCU-1800, 2016, 2 pages.
Viavi Solutions Inc., OneExpert ONX CATV 630, Extended Quick Start Guide v1, 2017, 153 pages.

* cited by examiner

*Primary Examiner* — Natasha W Cosme
(74) *Attorney, Agent, or Firm* — DLA Piper LLP (US)

(57) ABSTRACT

Systems and methods for detecting leakage in a cable network system are disclosed. In at least some illustrative embodiments, a system may include a digital tagger operable to generate a digital tag including a chirp signal configured to be placed on a downstream signal path of the cable network system, and a cable network test instrument configured detect the digital tag in wireless signal data received from the cable network system when a point of ingress is presented in the cable network system. The network test instrument may be operable to provide a user-perceptible indication when the digital tag is detected to inform a technician or other user that a flaw in the cable network system is nearby.

8 Claims, 7 Drawing Sheets

SYSTEMS AND METHODS FOR DETECTING LEAKAGE IN A CABLE NETWORK SYSTEM

CROSS-REFERENCE TO RELATED APPLICATION

This application claims the benefit of U.S. Provisional Patent Application Ser. No. 62/650,131, filed Mar. 29, 2018, the entire disclosure of which is incorporated by reference herein.

TECHNICAL FIELD

The present disclosure relates generally to data-over-cable or cable network system testing, and, more particularly, to instruments and methods for detecting leakage from a cable network system.

BACKGROUND

Most cable network systems are coaxial-based broadband access systems that may take the form of all-coax network systems, hybrid fiber coax (HFC) network systems, or radio frequency over glass (RFOG) network systems. Cable network system designs typically use a tree-and-branch architecture that permits bi-directional data transmission, including Internet Protocol (IP) traffic between the cable system head-end and customer locations. There is a forward or downstream signal path (from the cable system head-end to the customer location) and a return or upstream signal path (from the customer location back to the cable system head-end). The upstream and the downstream signals occupy separate frequency bands. In the United States, the frequency range of the upstream band is from 5 MHz to 42 MHz, 5 MHz to 65 MHz, 5 MHz to 85 MHz, or 5 MHz to 204 MHz, while the downstream frequency band is positioned in a range above the upstream frequency band.

Customer locations may include, for example, cable network system (e.g., CATV) subscriber's premises. Typical signals coming from a subscriber's premises include, for example, set top box DVR/On Demand requests, test equipment data channels, and Internet Protocol output cable modem carriers defined by the Data Over Cable Service Interface Specification (DOCSIS), which is one communication standard for bidirectional data transport over a cable network system.

Egress or leakage from the cable network system results from flaws in the cable network system that provide points of ingress for noise, which can reduce the quality of service of the system. Service operators have utilized two basic types of leakage detection gear to locate such points of ingress. One type of gear utilizes a signal level meter with an antenna designed to receive signals in the cable network system band. A maintenance/service technician walks around a subscriber's premises monitoring the signal level meter to identify flaws in the wiring and network devices at the subscriber's premises.

The other type of gear is so-called "truck-mounted" units, which are mounted in vehicles that are driven along the data lines and nodes of the cable network system, generally by maintenance/service technicians, to monitor leakage along the cable network system.

SUMMARY

According to one aspect of the disclosure, a system for detecting leakage in a cable network system is disclosed. The system includes a digital tagger operable to generate a digital tag including a chirp signal, which is placed on the downstream signal path of the cable network system. The system also includes a cable network test instrument such as, for example, a signal level meter. When a flaw (i.e., a point of ingress) is present in the cable network system, the cable network test instrument is configured detect the digital tag in wireless signal data received from the cable network system. The network test instrument is operable to provide a user-perceptible indication when the digital tag is detected to inform the technician or other user that a flaw in the cable network system is nearby. The user-perceptible indication may include a visual indication or audible indication.

The network test instrument may be mounted in a truck to detect the flaw from the road, thereby enabling the operator to find flaws faster. In some embodiments, the network test instrument is configured to detect the digital tag in a signal of less than about 10 µV/meter from 21.2 feet at 60 miles per hour based on signal data taken over 240 milli-seconds (mSecs). In some embodiments, the network test instrument is configured to detect the digital tag in a signal of less than about 10 µV/meter from 7.0 feet at 30 miles per hour based on signal data taken over 240 mSecs.

According to another aspect, a cable network test instrument is disclosed. The cable network test instrument includes circuitry operable to detect a chirp signal present in wireless signal data received from the cable network system when a point of ingress is presented in the cable network system, and circuitry operable to provide a user-perceptible indication when the digital tag is detected to inform a technician or other user that a flaw in the cable network system is nearby. In some embodiments, the cable network test instrument may include a signal level meter operable to detect the chirp signal.

According to another aspect, a system for detecting leakage in a cable network system comprises a digital tagger operable to generate a digital tag including a chirp signal configured to be placed on a downstream signal path of the cable network system. The digital tagger may be operable to place the chirp signal between adjacent quadrature amplitude modulation (QAM) carriers on the downstream signal path of the cable network system.

BRIEF DESCRIPTION OF THE DRAWINGS

The detailed description particularly refers to the following figures, in which.

DETAILED DESCRIPTION OF THE DRAWINGS

Figure 1:
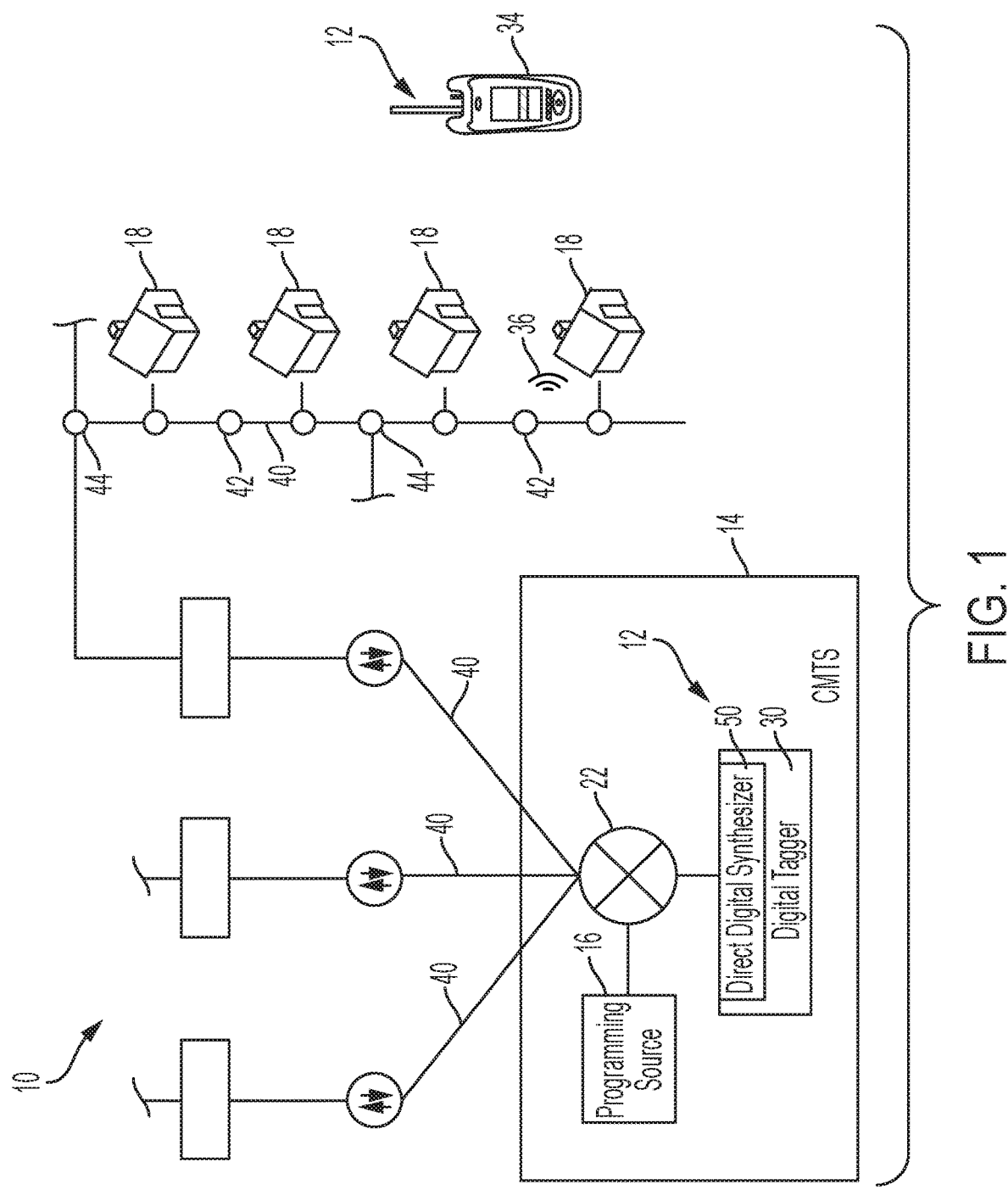
FIG. 1 is a simplified diagram of a cable network system and an instrument system for detecting leakage in the network system.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the invention as defined by the appended claims.

Figure 3:
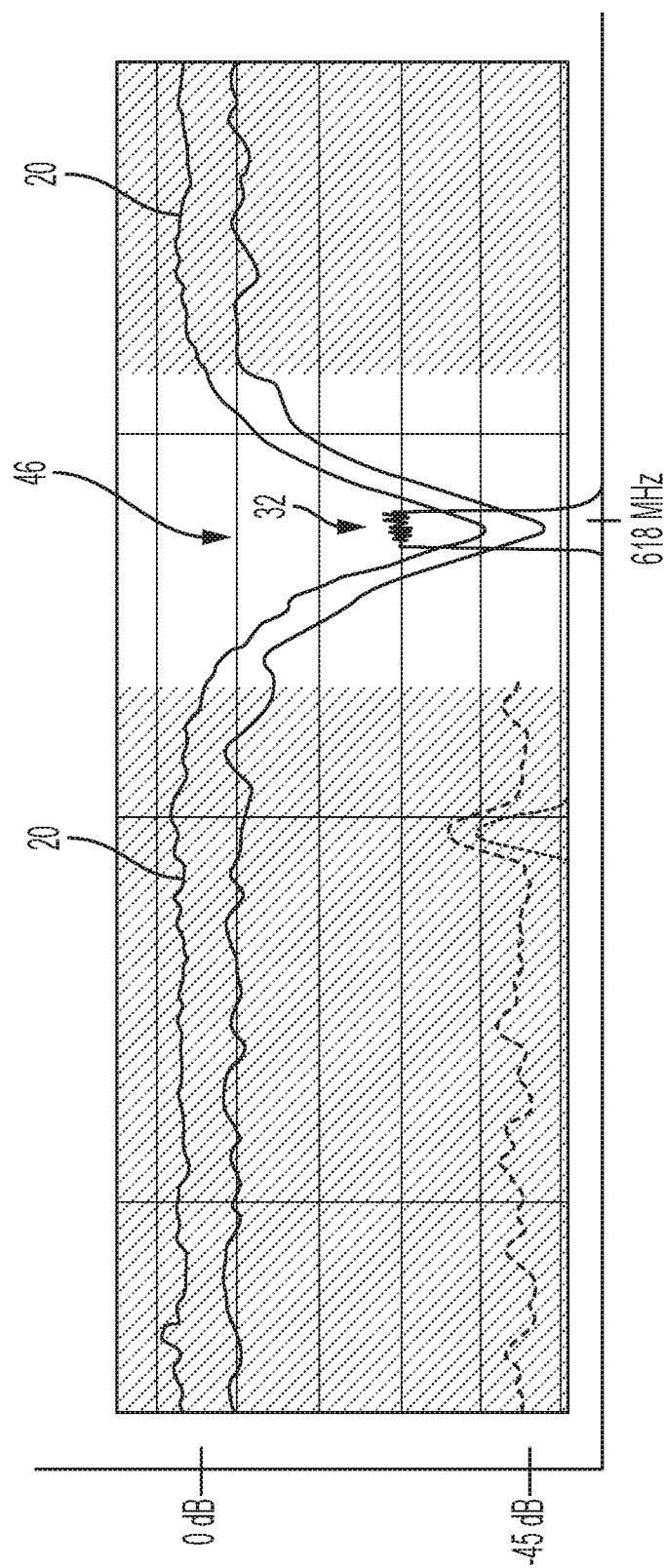
FIG. 3 is a chart showing adjacent carriers of the cable network system of FIG. 1 with the digital tag placed between the adjacent channels.

As shown in FIG. 1, a cable network system 10 and a cable network test instrument system 12 for detecting leakage from the system 10 are shown. The cable network system 10 includes a Cable Modem Termination System (CMTS) 14 that may be located at a cable company's head end or local office. The CMTS 14 includes a programming source 16 that generates programming material for distribution to subscribers on the cable network system 10. In the illustrative embodiment, the CMTS 14 obtains and modulates programming material onto appropriate carriers 20 (see FIG. 3) for distribution to cable modems 18 located at subscribers' premises. Subscribers' premises may include offices, homes, apartments, or other spaces at which CATV content is desired.

The cable network system 10 may include any number of "upstream" and "downstream" channels and carriers 20 within each channel to carry data between the CMTS 14 and the cable modems 18 on the system 10. In the illustrative embodiment, signals from multiple programming sources are combined for distribution by a combiner 22 located at the CMTS 14.

The cable network test instrument system 12 includes a digital tag transmitter 30 that is also located at the CMTS 14 in the illustrative embodiment. As described in greater detail below, the digital tag transmitter 30 is operable to generate a number of digital tags 32 (see FIG. 3) that are placed by the combiner 22 between adjacent carriers of the cable network system 10. In the illustrative embodiment, the carriers 20 and the digital tags 32 are combined for distribution downstream to subscribers over the forward path. The instrument system 12 also includes a signal level meter 34 that is positioned downstream of the CMTS 14 and is configured to detect the digital tags when a flaw 36 (i.e., point of ingress) is present in the cable network system 10.

The CMTS 14 is connected to the cable modems 18 via a plurality of data lines 40 such as, for example, coaxial cable and/or optical fiber that transport the CATV signals. In some embodiments, the CATV signals are transported as radio frequencies (RF). The signals may also be transported in hybrid systems including optical transmission portions in which the RF signals are converted to light for fiber optic transmission over some portions of the signal path and as RF signals over other portions of the signal path. The CMTS 14 also communicates with the other components of the cable network system 10 via the Internet. To do so, the CMTS 14 is configured to convert signals it receives from each cable modem 18 into Internet Protocol (IP) packets, which are then transmitted over the Internet.

The cable network system 10 also includes a number of nodes 42, 44. The nodes include a number of amplifiers 42 that are positioned throughout the cable network system 10 to compensate for signal loss caused by, for example, imperfections in the data lines or splitting of the signal during distribution. The cable network system 10 also includes a plurality of distribution taps 44 that provide points at which the subscribers' premises (and hence the cable modems 18) may be connected. In the illustrative embodiment, a single distribution tap 44 is connected to a single subscriber's premises via a coaxial cable. It should be appreciated that in other embodiments one or more of the taps may split the signals for distribution into two, four, or eight subscribers' premises.

As described above, the cable network test instrument system 12 includes a digital tag transmitter 30 that is operable to generate a number of digital tags 32. The transmitter 30 is shown in FIG. 1 at the CMTS, but it should be appreciated that in other embodiments the transmitter 30 may be external to the CMTS and the digital tags 32 combined with the signals from the CMTS downstream before being output to the rest of the cable network system 10. In the illustrative embodiment, the digital tag transmitter 30 is operable to a place a tag 32 at a number of center frequencies, including 138 MHz, 350 MHz, 618 MHz, 760 MHz, and 1200 MHz, which are located in gaps, such as gap 46 in FIG. 3, between adjacent carriers 20 in the downstream path of the cable network system 10.

Figure 4:
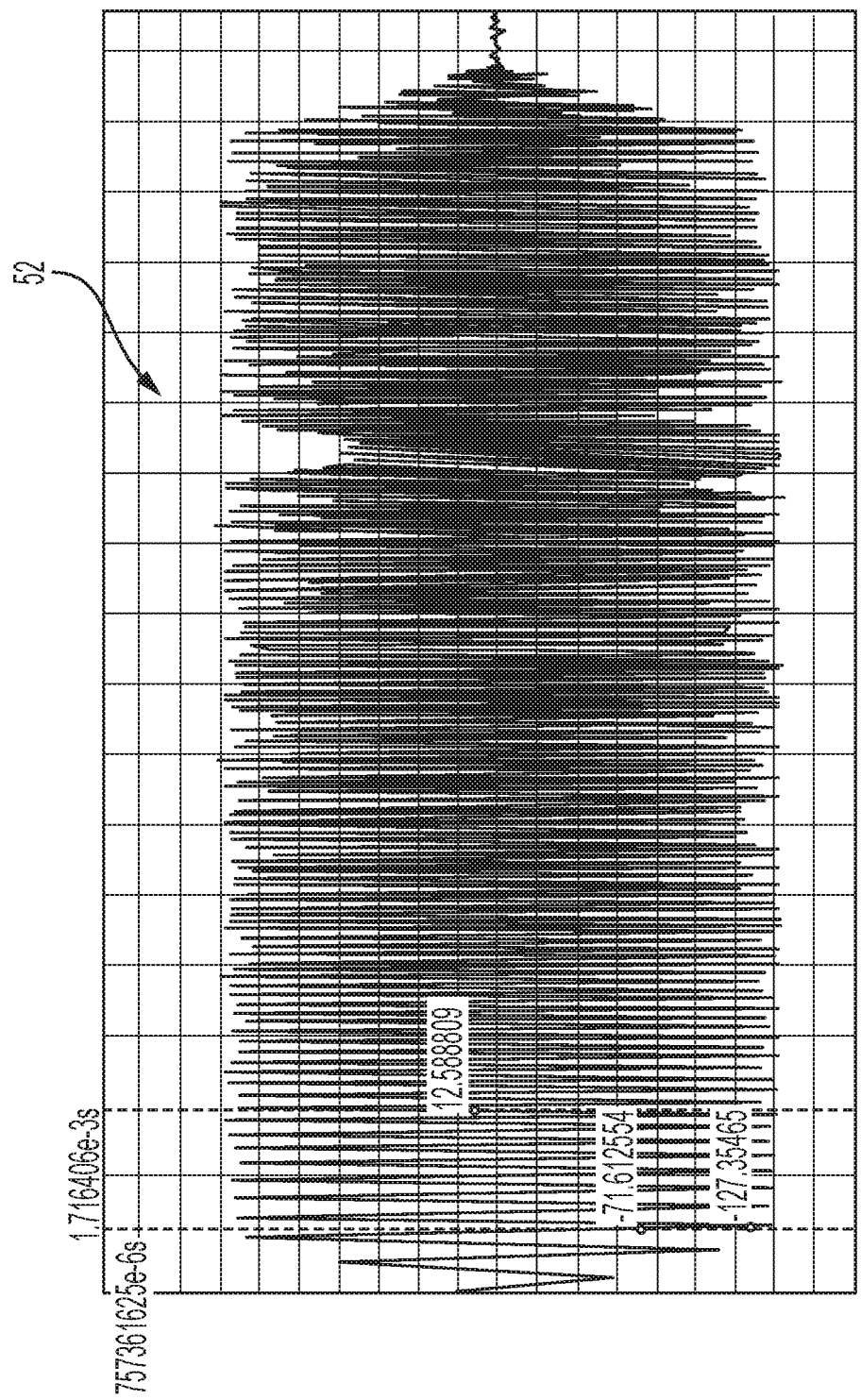
FIG. 4 is a chart showing a chirp signal generated by the direct digital synthesizer circuit of FIG. 2.

In the illustrative embodiment, the digital tag transmitter 30 includes a direct digital synthesizer circuit 50 that is housed in a casing or other housing at the CMTS 14. The synthesizer circuit 50 is configured to generate a chirp signal 52 (see FIG. 4) for each digital tag 32. As used herein, a "chirp signal" refers to a sweep signal in which the frequency of varies linearly over time. As shown in FIG. 4, each chirp signal 52 starts with an initial frequency, which increases linearly over time. Each chirp signal 52 occupies a narrow bandwidth. In the illustrative embodiment, the bandwidth of the chirp signal 52 is about 40 kHz and sweeps from ±20 kHz of its corresponding center frequency. As described above, the center frequencies in the illustrative embodiment are 138 MHz, 350 MHz, 618 MHz, 760 MHz, and 1200 MHz. The transmission time for the synthesizer circuit 50 to transmit the chirp signal 52 is about 40 msec (25 Hz).

Figure 2:
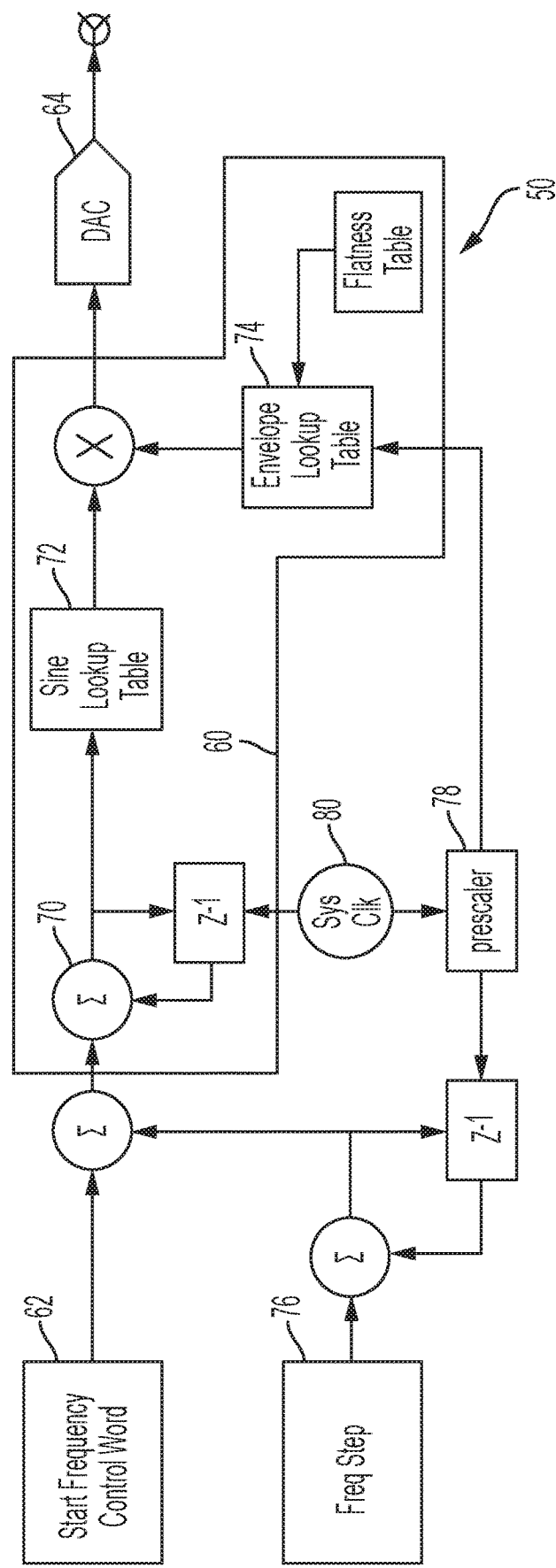
FIG. 2 is a simplified block diagram of a direct digital synthesizer circuit of a digital tagger shown in FIG. 1.

The illustrative synthesizer circuit 50 shown in FIG. 2 may be included in a microprocessor or other electric circuit. The synthesizer circuit 50 includes a numerically-controlled oscillator 60 that is operable to generate the sinusoidal wave form of the chirp signal 52, a frequency control register 62 that includes the start frequency control word that controls the period of the sinusoidal wave form, and a digital-to-analog converter (DAC) 64 configured to convert the digital chirp signal output from the numerically-controlled oscillator 60 to an analog signal, which is fed to the combiner 22 for distribution on the cable network system 10. It should be appreciated that in other embodiments the chirp signal may be generated digitally and could be fed into a DOCSIS Remote Phy as I/Q samples.

The oscillator 60 includes a phase accumulator 70 that receives the start frequency control word. In the illustrative embodiment, the start frequency, which is 20 kHz less than the center frequency of the particular chirp signal, and is the initial frequency of the chirp signal output by the oscillator 60. The output of the phase accumulator 70 is provided to a sine lookup table 72. The output of the sine lookup table 72 is multiplied by the output of an envelope lookup table 74, which is adjusted in amplitude to compensate for frequency response by a flatness table to provide a substantially flat frequency response. It should be appreciated that the envelope lookup table 74 is shaped to minimize the spectrum splatter of the chirp signal.

To add phase and thereby increase the frequency of the signal output by the oscillator 60, the synthesizer circuit 50 includes a frequency step block 76 that increases the initial frequency with each clock cycle. In the illustrative embodiment, the synthesizer circuit 50 includes a prescaling circuit 78 so that the frequency step may be at a slower rate than the main clock 80. For example, the main clock 80 has a rate of 3.5 GHz, and the frequency step is at 10 MHz. With each cycle of the prescaler 78, the start frequency control word of the frequency control register 62 is step changed to a new frequency control word to add phase, which is fed to the oscillator 60 to increase the frequency. This process continues until the chirp signal 52 shown in FIG. 4 is generated by the synthesizer circuit 50. As described above, the transmission time for the chirp signal 52 is about 40 msec.

Figure 5:
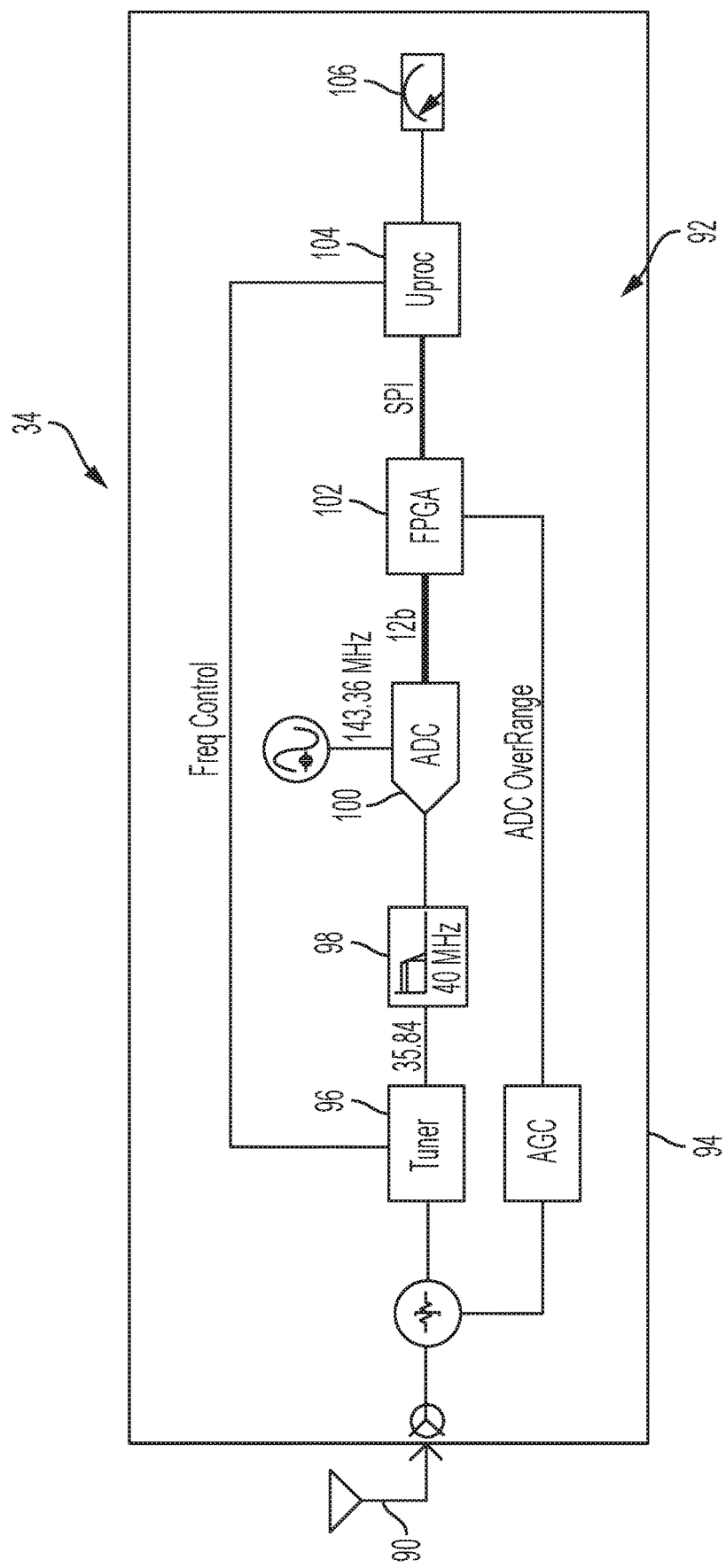
FIG. 5 is a simplified block diagram of a signal level meter of the instrument system of FIG. 1.

As described above, the instrument system 12 also includes a signal level meter 34 that is configured to detect the chirp signals 52 (and hence the digital tags 32) generated by the tag transmitter 30. As shown in FIG. 5, the signal level meter 34 includes an antenna 90 that is connected to a number of electronic components 92 housed in an outer casing 94. The hardware of the signal level meter 34 is included in, for example, the OneExpert CATV ONX-630 meter, which is commercially available from Viavi Solutions, Inc. The electronic components 92 include a tuner 96, which receives wireless signals received by the antenna 90. The tuner 96 is configured to selectively tune, demodulate, and perform other functions to prepare the wireless signals for further processing by the other electronic components 92 of the meter 34.

The output of the tuner 96 is passed through a filter 98 before being fed to an analog-to-digital converter (ADC) 100. Samples from the ADC 100 are fed to an Field Programmable Gate Array (FPGA) 102, which is described in greater detail below. The signal level meter 34 also includes a microprocessor 104 that controls the operation of the other electronic components 92. As shown in FIG. 5, the microprocessor 104 communicates with the FPGA 102 and sends signals to a display 106 for display to the technician. The display 106 may be a touch-screen operable to receive inputs from the technician to control the operation of the meter 34. It should be appreciated that the signal level meter 34 may also include a keyboard or another user interface configured to receive inputs from the technician to control the operation of the meter.

Figure 6:
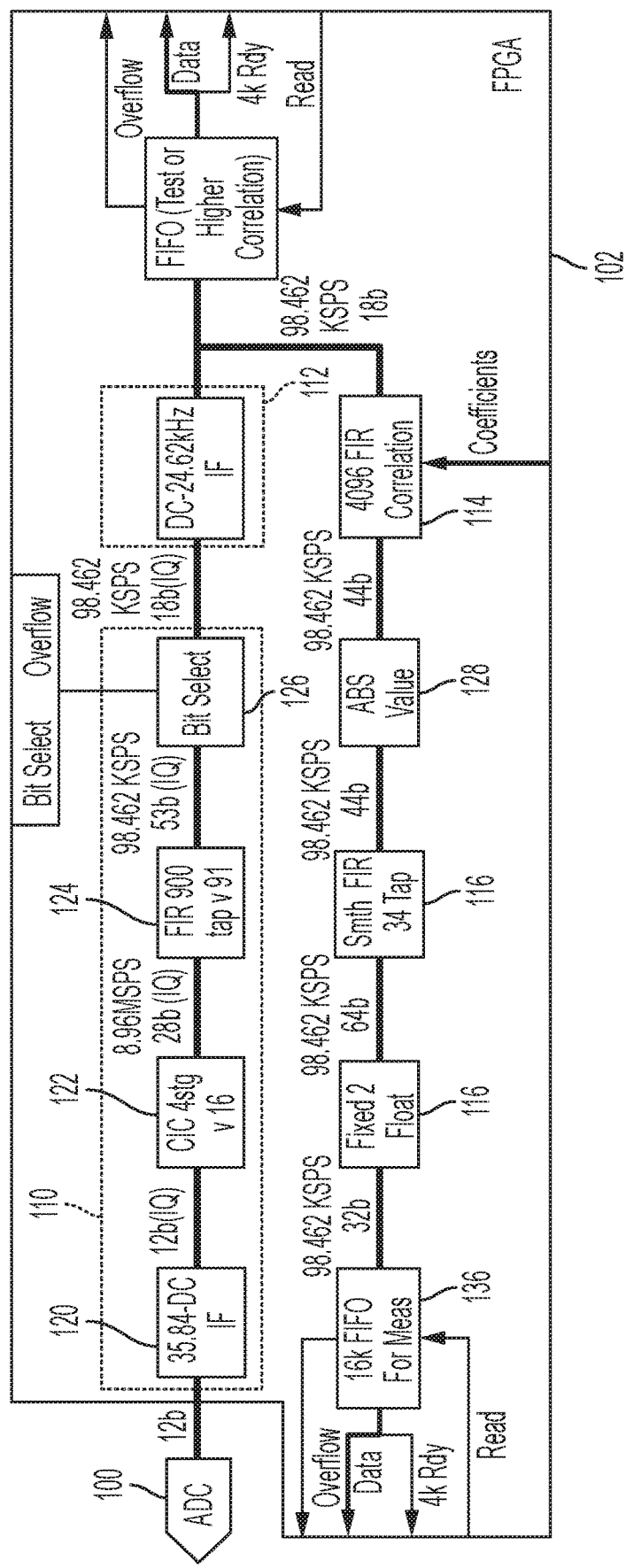
FIG. 6 is a simplified block diagram of a portion of the Field Programmable Gate Array (FPGA) of the signal level meter of FIG. 5.

The FPGA 102 and the microprocessor 104 are configured to process the samples from the ADC 100 to recover the digital tags 32. As shown in FIG. 6, FPGA 102 includes a digital down-converter 110, a digital up-converter 112, a signal correlator 114, and a number of filters 116 to process the samples from the ADC 100. Samples from the ADC 100 are fed to block 120 of the digital down-converter 110 in which the samples are turned into a complex signal by multiplying the samples with a signal that is ¼ of the sampling rate of the ADC 100. In the illustrative embodiment, the sampling rate of the ADC 100 is 143.36 MHz. The signal in block 120 is therefore 35.84 MHz. For the magnitude (I) of the complex number, the samples are multiplied by 1, 0, −1, 0 . . . . For the phase (Q) of the complex number, the samples are multiplied by 0, 1, 0, −1 . . . . The complex signals are then fed to block 122 in which a moving average of 16 filters is sized to decimate each signal by 16. The decimated signals are further decimated in block 124 by 91 such that a total decimation of 1491 is achieved in the digital down-converter 110. The digital down-converter 110 then selects the appropriate bits in block 126 before the signals are fed to the digital up-converter 112.

The frequency of the signals generated by the digital down-converter 110 are at an output frequency of 98.462 kHz. In the digital up-converter 112, those signals are multiplied by signal that is ¼ of the output frequency of the digital down-converter 110 (i.e., 24.62 kHz). The output of the digital up-converter 112 is provided to the signal correlator 114.

In the illustrative embodiment, the correlator 114 operates on 4096 pulses (i.e., approximately the same time frame as the transmitter). The correlator 114 is configured to determine the similarity of the received signals to the chirp signal 52 by convolving the signals from the digital up-converter 112 with a conjugated and time-reversed version of the chirp signal 52. The output of the correlator 114 is provided to block 128, which detects the absolute values of the correlator signals. The output of the block 128 is passed through the filters 116, which make the pulses wider than one sample, before being transmitted to the microprocessor 104.

Figure 7:
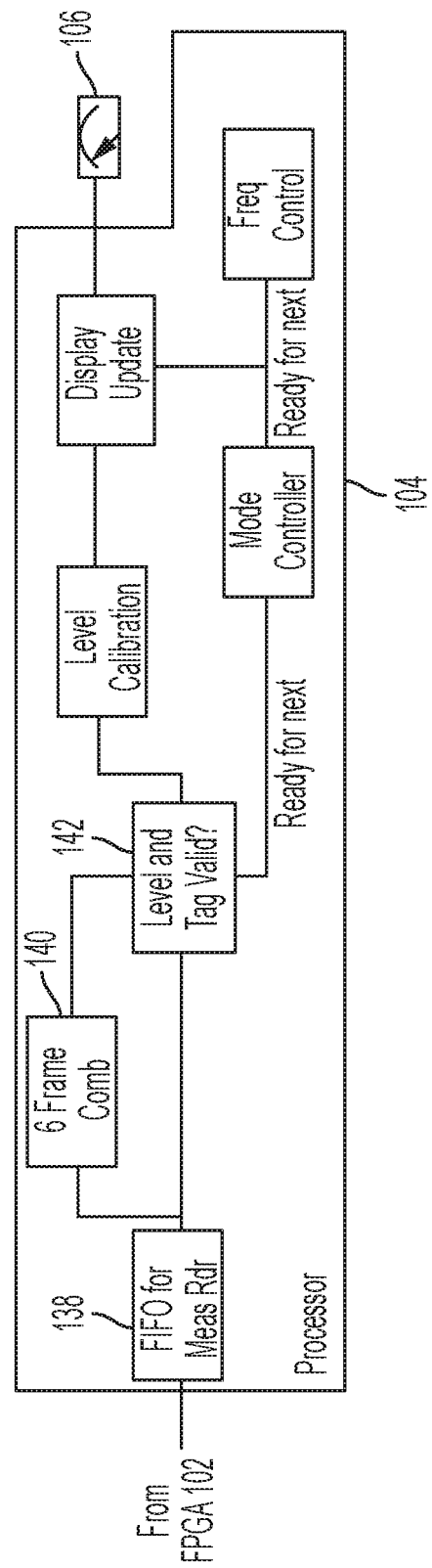
FIG. 7 is a simplified block diagram of the processor of the signal level meter of FIG. 5.

As shown in FIG. 7, the microprocessor 104 includes a FIFO circuit 138 for reading the individual 4096 correlator output values from the FPGA's FIFO 136. The individual 4096 correlator output values are associated as an element. The FIFO 138 is configured to analyze the 4096 correlator output values to determine if they indicate a signal level that exceeds 10 µV/meter. If the signal level appears to be higher than the 10 µV/meter, the result is fed to the block 142 of the microprocessor 104 so that the system can detect large leaks in as little as 80 mSec.

The elements from the FIFO circuit 138 are also fed to a comb filter 140 of the microprocessor 104. As described above, the transmission time of the chirp signal 52 is 40 mSec. In the illustrative embodiment, the comb filter 140 includes six frames or blocks of 40 mSec. Every 40 mSec (4096 FIFO output points), an element from the FIFO 138 is added to one of the frames of the comb filter 140. After 240 mSec, all of the frames of the comb filter 140 are full. An element is then removed when another is added in a FIFO manner to keep the frames full, and the comb filter 140 averages elements (index by index) to produce an output.

When a new element is added to the comb filter 140, the 4096 points in the frame of the comb filter 140 are analyzed to find the maximum point. The index at the maximum point is saved as a maximum index. This maximum index is then compared to the previous maximum index. If the maximum index is within +/−2 (inclusive) of the previous maximum index, the maximum index is determined to be good. For example, if the previous max_index=400 and the new max_index=402, the new maximum index is determined to be good. Due to wraparound, if the previous max_index=4094 and the new max_index=0, the new maximum index is also determined to be good, but if the previous max_index=500 and the new max_index=675, the new maximum index is determined to be bad. This allowance of +/−2 is to allow for error between the clocks of the transmitter and receiver.

In block 142, the microprocessor 104 determines whether the received signals include the chirp signal 52. In the illustrative embodiment, after 240 millisecond (6 iterations of the above) from the previous result output, the comb filter output is analyzed. The maximum and average of the 4096 output values are found. If SIGNAL is 20*log 10(maximum) and NOISE is 20*log 10(average), the tag is determined to be detected if SIGNAL−NOISE>3.0 and greater than or equal to 50% of the maximum indexes were determined to be good (in this case, 3 or more of the 6 iterations have been found to have a max index+/−2 of the previous iteration). When the microprocessor 104 determines that the chirp signal 52 is present, the microprocessor 104 may operate the display 106 to signal to the technician that a flaw in the cable network system 10 is present nearby.

It should be appreciated that coding gains of 10s of dB in amplitude are achieved because the power of the received signal is amplified by pulse compression of the chirp signal 52. Exemplary minimum signal levels at the various center frequencies are provided in the table below.

| Center Frequency | Minimum Signal Level |
|---|---|
| 138 MHz | 0.43 μV/m |
| 350 MHz | 1.08 μV/m |
| 618 MHz | 1.91 μV/m |
| 760 MHz | 2.35 μV/m |
| 1200 MHz | 3.70 μV/m |

In the illustrative embodiment, the system 12 is configured to detect the chirp signal 52 in a signal of greater than about 10 μV/meter from 7 feet at 60 miles per hour based on signal data taken over 80 mSecs. The system 12 is configured to detect the digital tag in a signal of greater than about 10 μV/meter from 3.5 feet at 60 miles per hour based on signal data taken over 80 mSecs. In the illustrative embodiment, the system 12 is configured to detect the chirp signal 52 in a signal of less than about 10 μV/meter from 21.2 feet at 60 miles per hour based on signal data taken over 240 mSecs. The system 12 is configured to detect the digital tag in a signal of less than about 10 μV/meter from 7.0 feet at 30 miles per hour based on signal data taken over 240 mSecs.

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected.

There are a plurality of advantages of the present disclosure arising from the various features of the method, apparatus, and system described herein. It will be noted that alternative embodiments of the method, apparatus, and system of the present disclosure may not include all of the features described yet still benefit from at least some of the advantages of such features. Those of ordinary skill in the art may readily devise their own implementations of the method, apparatus, and system that incorporate one or more of the features of the present invention and fall within the spirit and scope of the present disclosure as defined by the appended claims.

The invention claimed is:

1. A system for detecting leakage in a cable network system, the system comprising:
    a digital tagger operable to generate a digital tag including a chirp signal configured to be placed on a downstream signal path of the cable network system, and
    a cable network test instrument configured detect the digital tag in wireless signal data received from the cable network system when a point of ingress is presented in the cable network system,
    wherein the network test instrument is operable to provide a user-perceptible indication when the digital tag is detected to inform a technician or other user that a flaw in the cable network system is nearby.

2. The system of claim 1, wherein the cable network test instrument includes a signal level meter operable to detect the chirp signal.

3. The system of claim 1, wherein the user-perceptible indication includes a visual indication or audible indication.

4. A cable network test instrument comprising:
    circuitry operable to detect a chirp signal present in wireless signal data received from the cable network system when a point of ingress is presented in the cable network system, and
    circuitry operable to provide a user-perceptible indication when the digital tag is detected to inform a technician or other user that a flaw in the cable network system is nearby.

5. The cable network test instrument of claim 4, wherein the cable network test instrument includes a signal level meter operable to detect the chirp signal.

6. The cable network test instrument of claim 4, wherein the user-perceptible indication includes a visual indication or audible indication.

7. A system for detecting leakage in a cable network system, the system comprising a digital tagger operable to generate a digital tag including a chirp signal configured to be placed on a downstream signal path of the cable network system.

8. The system of claim 7, wherein the digital tagger is operable to place the chirp signal between adjacent QAM carriers on the downstream signal path of the cable network system.

* * * * *